United States Patent [19]

Quate

[11] Patent Number: 4,575,822

[45] Date of Patent: Mar. 11, 1986

[54] METHOD AND MEANS FOR DATA STORAGE USING TUNNEL CURRENT DATA READOUT

[75] Inventor: Calvin F. Quate, Palo Alto, Calif.

[73] Assignee: The Board of Trustees of The Leland Stanford Junior University, Stanford, Calif.

[21] Appl. No.: 466,563

[22] Filed: Feb. 15, 1983

[51] Int. Cl.[4] ........................ G11C 7/00; G11C 11/34
[52] U.S. Cl. .................................... 365/174; 365/114; 369/126
[58] Field of Search ...................... 365/174, 118, 114; 369/126

[56] References Cited

U.S. PATENT DOCUMENTS

| | | | |
|---|---|---|---|
| 3,072,543 | 1/1963 | Lubow et al. | 369/126 |
| 3,761,895 | 9/1973 | Ellis et al. | 365/118 |
| 3,920,930 | 11/1975 | Sobczyk | 369/126 |
| 4,106,107 | 8/1978 | Goodman | 369/126 |
| 4,340,953 | 7/1982 | Iwamura et al. | 365/174 |

FOREIGN PATENT DOCUMENTS 0139643  10/1980  Japan .................................. 369/126

OTHER PUBLICATIONS

Binning et al, "Surface Studies by Scanning Tunneling Microscopy", Physical Review Letters, vol. 49, No. 1, Jul. 5, 1982, pp. 57-61.

"Microscopy by Vacuum Tunneling", Physics Today Apr. 1982, pp. 21-22.

*Primary Examiner*—Stuart N. Hecker
*Assistant Examiner*—Glenn A. Gossage
*Attorney, Agent, or Firm*—Flehr, Hohbach, Test, Albritton & Herbert

[57] ABSTRACT

Disclosed is a digital memory in which data is stored by establishing perturbations in a surface of a substrate and thereafter identifying the perturbations by establishing a tunnel electron current between the surface of the substrate and a movable probe. The perturbations can be physical, electrical, or magnetic, for example, such that the tunneling electron current is affected thereby. Storage area for a bit of data can be reduced to the order of $10^{-4}$ square microns, and the volume of a 100 megabyte mass storage can be reduced to the order of a cubic centimeter.

21 Claims, 5 Drawing Figures

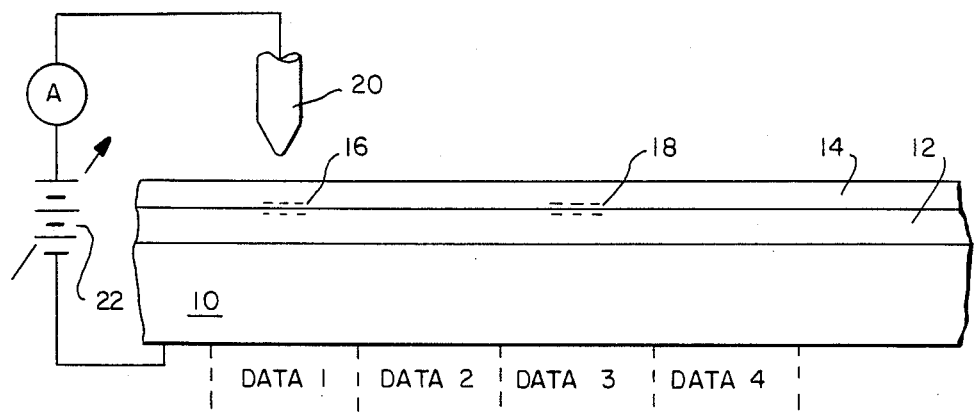
FIG.—1
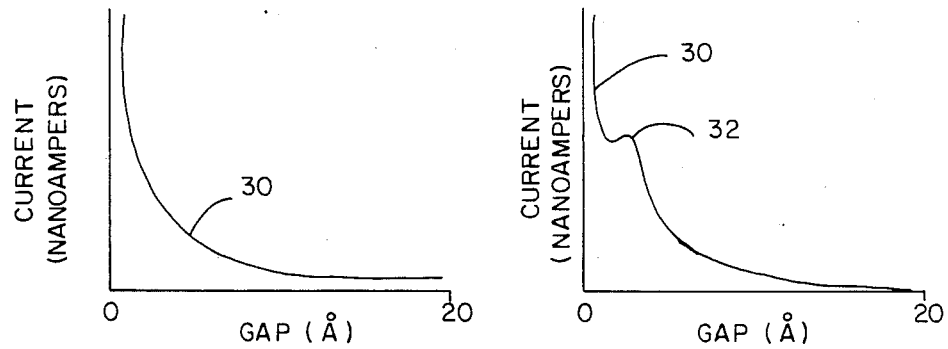
FIG.—2A  FIG.—2B
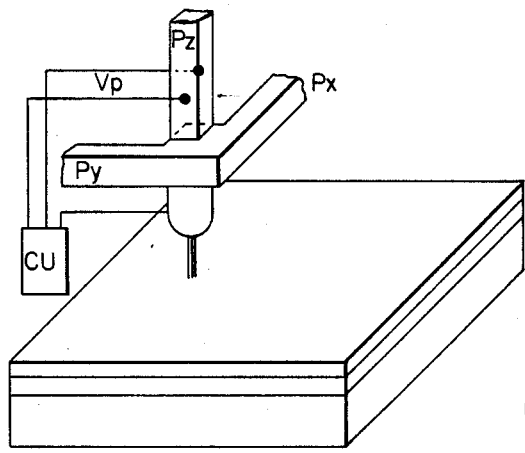
FIG.—3
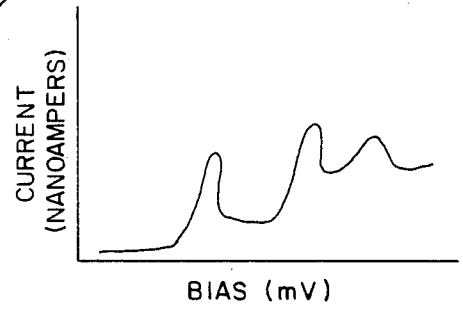
FIG.—4

METHOD AND MEANS FOR DATA STORAGE USING TUNNEL CURRENT DATA READOUT

This invention relates generally to computer memory devices, and more particularly the invention relates to mass storage of data using tunnel current measurements for data readout.

Advances in semiconductor processing techniques including very large scale integration (VLSI) of circuits and arrays in semiconductor wafers have led to drastic reductions in the size of digital computers. The single chip microprocessor now has a computing power for use in many computer applications.

However, while semiconductor components of computer systems have continually decreased in size, the bulk data memory units have limited the size reduction actually realized in the total computer system. Typically, a mass storage device for 100 megabytes of data comprises a hard disc. The disc, drive motor, and head assembly occupy space on the order of one cubic meter. With each data bit recorded on the disc surface requiring approximately 100 square microns of storage area. Attempts have been made to reduce the size of bulk memories by employing other technologies, such as magnetic bubble memories. A magnetic bubble memory requires approximately ten square microns of storage area for one bit—a tenfold decrease over hard discs. However, magnetic memories have not realized commercial success due to slow access times and other limitations.

The present invention is directed to a bulk storage memory having a greatly reduced size. Storage area for one bit of data is reduced to the order of $10^{-4}$ square microns of surface area, and the volume of a 100 megabyte mass storage memory is reduced to the order of a cubic centimeter. Moreover, the reduction in size does not compromise data rate and access time.

Accordingly, an object of the present invention is an improved data memory.

Another object of the invention is an improved method of storing and reading digital data in bulk storage.

A feature of the invention is the use of tunnel currents in reading stored data.

Another feature of the invention is a recording surface which need not have a defined pattern of storage cells.

Briefly, a memory in accordance with the invention includes a monolithic body having a major surface. Perturbations are formed in the monolithic body which can be detected by establishing and monitoring a tunnel current between the surface and a probe associated therewith.

In a preferred embodiment, a substrate has a major surface and includes at least one electrically insulative or dielectric layer at the major surface. Pockets of electric charge are selectively formed at a surface of the dielectric layer for the storage of digital data bits, and the charge pockets are later detected by measuring tunnel current between the substrate and a probe brought in close proximity to the charge pocket on the dielectric layer surface.

In a specific embodiment, a dielectric layer of silicon oxide is formed on the surface of a doped semiconductor substrate, and a layer of silicon nitride is formed on the layer of silicon oxide. Charge is stored at the interface of the dielectric layers by bringing a probe in contact with the silicon nitride dielectric layer and establishing sufficient voltage across the dielectric layers by voltage biasing the substrate and probe whereby electrons tunnel through the dielectric layers. The probe is then moved from the dielectric surface and the tunnel electrons remain trapped on the interface of the dielectric layers. In reading the stored data represented by the trapped electrons, a probe is placed in close proximity to the silicon nitride layer and the trapped electrons, and the spacing between the probe and the dielectric surface is varied while the substrate and probe are biased to establish a tunnel electron current. In some embodiments, the probe bias for reading data is reversed from the probe bias in recording data. The measured tunnel current indicates either the presence or absence of stored charge on the interface of the dielectric layers.

In another embodiment, the perturbations are formed by physical or magnetic disruption of the surface of a monolithic body such as by application of a physical probe, a focused laser beam, electron beam, or other radiation or particle beam. Again, the perturbations are detected by establishing and measuring a tunnel current between the surface of the monolithic body and a probe. The perturbations interact with the tunneling electrons and affect the measured current. In other embodiments, the perturbations of the surface can be established by deposited particles which may be conductive, insulative, or magnetic in nature. The perturbations may be vortices in superconducting material which can be attached to pinning sites in the material.

The invention and objects and features thereof will be more readily apparent from the following detailed description and appended claims when taken with the drawing, in which:

FIG. 1 is a section view of a portion of a memory in accordance with one embodiment of the invention illustrating the storage of and accessing data bits.

FIGS. 2A and 2B are curves illustrating measured tunnel electron current in the presence and absence of perturbations such as stored electrons.

FIG. 3 is a functional block diagram of apparatus for storing and accessing data in accordance with one embodiment of the invention.

FIG. 4 is a curve illustrating the reading of slow data by modulating probe bias.

Referring now to the drawings, FIG. 1 is a section view of a portion of a memory in accordance with one embodiment of the invention illustrating the storage and accessing of data bits. The memory comprises a substrate 10 such as N doped single crystalline silicon on which is formed a layer 12 of silicon oxide having a thickness on the order of 5-50 angstroms. Such a silicon oxide layer is readily and accurately formed by the thermal oxidation of the substrate 10 using conventional semiconductor processing techniques. A second dielectric layer 14 of silicon nitride is then deposited on the surface of the silicon oxide layer 12. The thickness of the silicon nitride layer is on the order of 5-50 angstroms.

The memory structure need not have any particular patterns as is typically employed in semiconductor memories. The semiconductor substrate and dielectric layers have a plurality of data storage locations which may be rectangular in configuration, for example, such as the data regions designated DATA 1, DATA 2, DATA 3, and DATA 4. Data is stored in each location by selectively forming electrical charge at the interface of the two dielectric layers 12, 14 such as the charge of electrons 16 in the DATA 1 location and the electrons 18 in the DATA 3 location.

Formation of the charge is accomplished by applying a voltage differential across the two dielectric layers between the probe and the substrate 10 by means of a variable voltage source 22 which is serially connected with a nanometer 24.

For example, a tunnel current will flow from the substrate 10 through the dielectric layers by applying a voltage differential on the order of 2–20 volts across the two dielectric layers. Upon termination of the voltage differential, the charge 16 and charge 18 becomes trapped at the dielectric interface. In establishing the tunnel current for capture of charge, the probe 20 can be brought into physical contact with the surface of layer 14. However, contact is not essential. The probe can be considered a moving gate contact as is employed in electronically erasable semiconductor read only memories (EEROM) where charge can be formed on a floating electrode by selectively generating a tunnel current between a substrate and the floating electrode. See for example Johnson et al, "16 K EE-PROM Relies on Tunneling for Byte-Erasable Program Storage", Electronics, Feb. 28, 1980, pgs. 113–117.

Thereafter, the stored data can be read by positioning the probe 20 in close proximity to but spaced from each data cell and creating a tunnel current across the gap between the probe 20 and the dielectric layer 14. This is similar to the use of vacuum tunneling in microscopy where tunnel current is used to indicate microscopic undulations in the surface of a material. See for example "Microscopy by Vacuum Tunneling", Physics Today, April 1982, pgs. 21, 22; Binning et al "Surface Studies by Scanning Tunneling Microscopy", Physical Review Letters, Vol. 49, No. 1, July 5, 1982, pgs. 57–61. In reading the stored data, the voltage bias between probe and surface can be reversed from the voltage bias in recording the data. FIGS. 2A and FIGS. 2B are plots illustrating tunnel current versus gap (in Angstroms) between the probe 20 and the surface of layer 18 when charge is not present and when a charge perturbation is present between the dielectric layers. In FIG. 2A it is noted that the current crops exponentially as a function of gap spacing. However, in FIG. 2B the stored charge causes an irregularity 32 in the otherwise exponential curve 30. The tunneling process, either elastic or inelastic, allows the tunneling electrons to exchange energy with the trapped charge and thereby perturb the tunneling current. Accordingly, by selectively moving the probe 20 to the various storage locations in the memory structure and establishing a tunnel current between the probe and the memory structure, the presence of a stored data bit (e.g. a stored charge) is determined by detecting the presence of an irregularity in the tunnel current as a function of gap width between the probe and storage structure. Vertical movement of the probe can be a few angstroms which is readily implemented by piezoelectric elements. In some instances it may be desirable to modulate the spacing between the probe and the substrate in order to measure the slopes of the curves in FIG. 2. This may be readily done by application of an ultrasonic wave to the probe.

The tip of probe 20 has a diameter preferably on the order of 30 Angstroms. Such a probe tip can be obtained by growing a gold crystal on a substrate and using the crystal as the surface irregularity that forms the probe. Alternatively, a suitable probe tip can be obtained by cladding platinum wire with silver, known as Wolleston wire, and then drawing the clad wire down to a diameter of the order of 50 angstroms. Thereafter, the silver can be removed by etching leaving the drawn platinum wire having a diameter of approximately 30 Angstroms. In another embodiment an aluminum layer can be formed on a silicon substrate. By heating the composite structure silicon whiskers will grow through the aluminum. Thereafter, the aluminum can be removed by etching leaving the silicon whiskers which can have a diameter on the order of 10–50 angstroms.

The apparatus for moving the probe across the memory structure for recording and reading data can be similar to the apparatus used in microscopy. FIG. 3 is a schematic representation of the structure utilized by Binnig et al, supra, for surface studies by scanning tunneling microscopy. Piezo drives $P_x$ and $P_y$ scan the probe, P, over the memory surface. The control unit (CU) applies the appropriate voltage $V_p$ to the piezo drive $P_x$ for a constant tunnel current $J_t$ at constant tunnel voltage $V_t$. For a surface with a constant work function the voltages applied to the piezo drives $P_x$, $P_y$, and $P_z$ give a function which reflects the presence or absence of stored charge in the memory storage cells. To compensate for the effect of microscopic undulations in the surface of the silicon nitride layer 18, the surface can be initially scanned as described by Binnig et al with the various undulations in the surface detected and recorded for use in establishing the correct gap distance between the probe and the silicon nitride layer surface at each memory cell. Vertical movement of the probe for varying the gap can be rapidly effected by applying an ultrasonic wave to the probe after positioning of the probe above the surface.

The memory described above with respect to FIG. 1 is a dynamic random access memory in which data can be selectively recorded, read, and erased. Periodic refreshment of the memory may be required to compensate for decay in captured charge.

Other memories, including archival read only memories, can be provided by establishing surface perturbations other than captured electrical charge. For example, a physical probe, a focused laser beam, an electron beam, or other forms of radiation beams and particle beams can create microscopic perturbations in the physical structure or magnetic properties of the memory. For example, the memory may comprise a surface layer of gadolinium terbium iron, and the heat from a focused laser beam will change the magnetic properties thereof. Such material has been used in disc memories with a laser beam producing magnetic domains which are elipsoids having surface dimensions of about 2 by 5 microns. See for example Gosch, "Magneto-Optics Packs Five-CM Disc With 10 Megabytes", Electronics, Dec. 29, 1982, pgs. 45 and 46. By physically disrupting the surface by a physical contact with a probe or by focused beam irradiation, an archival memory is provided. In each of the memories, however, the stored data is read by measuring tunnel electron currents. For dynamic storage the physical perturbations can be erased by annealing, for example.

In another embodiment of the invention, recorded data can be read by maintaining the gap between probe and surface constant and varying the electrical voltage therebetween. Inelastic tunneling of electrons will vary the measured current as a function of voltage. FIG. 4 is a plot of current (in nanoamperes) versus bias voltage illustrating current peaks resulting from millivolt variations in voltage. The presence of captured charge will vary the position of the current peaks. This form of tunneling is familiar in the field of tunneling spectroscopy.

There has been described a memory structure and method of storing data therein which allows greatly reduced size of a bulk data storage. While the invention has been described with reference to specific embodiments, the description is illustrative of the invention and is not to be construed as limiting the invention. For example, the storage medium may comprise a superconducting film in which perturbations take the form of vortices in the superconducting film. The dielectric layer may comprise other oxides such as aluminum oxide or a polymer such as photoresist polymers. Further, in a two layer structure, one layer can be metal while only one layer is a dielectric.

Accordingly, various modifications and applications may occur to those skilled in the art without departing from the true spirit and scope of the invention as defined by the appended claims.

What is claimed is:

1. A data memory comprising a substrate having a major surface, means for selectively forming perturbations in said surface, and probe means for detecting the presence of said perturbations, said probe means including a conductive probe, means for moving said conductive probe in close proximity to and spaced from the layer, means for voltage biasing said probe and said substrate whereby a tunnel electron current flows between said surface and said conductive probe, and means for measuring said tunnel electron current.

2. The data memory as defined by claim 1 wherein said means for moving said conductive probe moves said probe along three axes of translation and said tunnel current is measured as a function of spacing of said probe from said surface.

3. The data memory as defined by claim 1 wherein said means for voltage biasing applies a modulated voltage between said probe and said substrate.

4. The data memory as defined by claim 1 wherein said substrate includes a layer of material, said major surface being a surface of said layer, and wherein said perturbations comprise physical disruptions of said surface of said layer.

5. The data memory as defined by claim 1 wherein said substrate includes a layer of material, said major surface being a surface of said layer, and wherein said perturbations comprise magnetic domains in said layer.

6. The data memory as defined by claim 1 wherein said substrate includes a layer of material, said major surface being a surface of said layer, and wherein said perturbations comprise electrical charge.

7. The data memory as defined by claim 1 wherein said substrate includes a layer of material, said major surface being a surface of said layer, and wherein said layer of material comprises a superconductive film and said perturbations comprise vortices in said superconductive film.

8. A data memory comprising a substrate having a major surface, a first layer of dielectric material on said major surface, a second layer of material on said first layer, means for selectively establishing electrical charge at the interface of said two layers, and probe means for detecting the presence of charge at said interface, said probe means including a conductive probe, means for moving said conductive probe in close proximity to and spaced from the surface of said second layer, means for voltage biasing said probe and said substrate whereby a tunnel electron current flows between said second layer and said conductive probe, and means for measuring said tunnel electron current.

9. The data memory as defined by claim 8 wherein said means for moving said conductive probe moves said probe along three axes of translation and said tunnel electron current is measured as a function of spacing of said conductive probe from said surface of said second layer.

10. The data memory as defined by claim 8 wherein said second layer comprises a metal.

11. The data memory as defined by claim 8 wherein said second layer comprises a dielectric material.

12. The data memory as defined by claim 11 wherein said substrate comprises a doped semiconductor material, said first layer of dielectric material comprises silicon oxide, and said second layer comprises silicon nitride.

13. A method of recording and reading data bits in a data storage means including a substrate, a first dielectric layer on a surface of said substrate, and a second conductive layer of material on said first layer, said method comprising the steps of selectively establishing electrical charge at the interface of said first and second layers, establishing tunnel currents between the surface of said second layer and a probe positioned in close proximity to and spaced from said surface, and measuring said tunnel current as the space between said probe and said surface is varied.

14. A method of recording and reading data bits in a data storage means including a substrate having a major surface, said method comprising the steps of selectively establishing perturbations in said surface, establishing a tunnel electron current between the surface of said material and a probe positioned in close proximity to and spaced from said surface, and measuring said tunnel electron current to thereby identify changes in current due to said perturbations.

15. The method as defined by claim 14 and further including the step of varying the spacing between said probe and said surface as said tunnel electron current is measured.

16. The method as defined by claim 14 wherein said step of establishing a tunnel electron current includes applying a modulated voltage between said probe and said substrate.

17. The method as defined by claim 14 wherein said step of selectively establishing perturbations includes establishing electrical charge in said major surface.

18. The method as defined by claim 14 wherein said step of selectively establishing perturbations includes the step of forming physical disruptions of said surface.

19. The method as defined by claim 14 wherein said step of selectively establishing perturbations includes depositing particles on said surface.

20. The method as defined by claim 14 wherein said step of selectively establishing perturbations includes forming magnetic domains in said surface.

21. The method as defined by claim 14 wherein said step of establishing a tunnel electron current includes applying a modulated spacing between said probe and said substrate.

* * * * *